(12) United States Patent
Pinter

(10) Patent No.: US 6,782,749 B2
(45) Date of Patent: Aug. 31, 2004

(54) MICROMECHANICAL COMPONENT

(75) Inventor: Stefan Pinter, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 37 days.

(21) Appl. No.: 10/239,327

(22) PCT Filed: Mar. 1, 2001

(86) PCT No.: PCT/DE01/00770
§ 371 (c)(1),
(2), (4) Date: Dec. 27, 2002

(87) PCT Pub. No.: WO01/69267
PCT Pub. Date: Sep. 20, 2001

(65) Prior Publication Data
US 2003/0101818 A1 Jun. 5, 2003

(30) Foreign Application Priority Data
Mar. 16, 2000 (DE) .......................................... 100 12 960

(51) Int. Cl.⁷ ............................................. G01P 15/00
(52) U.S. Cl. ................................................. 73/514.38
(58) Field of Search ......................... 73/514.38, 514.36, 73/514.32

(56) References Cited

U.S. PATENT DOCUMENTS 5,364,497 A    11/1994  Chau et al.
5,610,335 A    3/1997   Shaw et al.
6,272,926 B1 * 8/2001   Fehrenbach et al. ..... 73/514.32

FOREIGN PATENT DOCUMENTS

DE           198 17 357        10/1999

* cited by examiner

Primary Examiner—Helen Kwok
(74) Attorney, Agent, or Firm—Kenyon & Kenyon

(57) ABSTRACT

The invention creates a micromechanical component, in particular an acceleration sensor, having a flexible spring device (F1, F2, F3) for the spring mounting of a mass (3) over a substrate (4), the flexible spring device (F1, F2, F3) being on the one hand connected with the mass (3) and being on the other hand anchored in the substrate (4). The flexible spring device (F1, F2, F3) has at least one flexible spring element (F2, F3) whose movability in relation to the substrate (4) is capable of being modified in order to modify the effective spring constant of the flexible spring device (F1, F2, F3).

23 Claims, 2 Drawing Sheets

MICROMECHANICAL COMPONENT

BACKGROUND OF THE INVENTION

Figure 1:
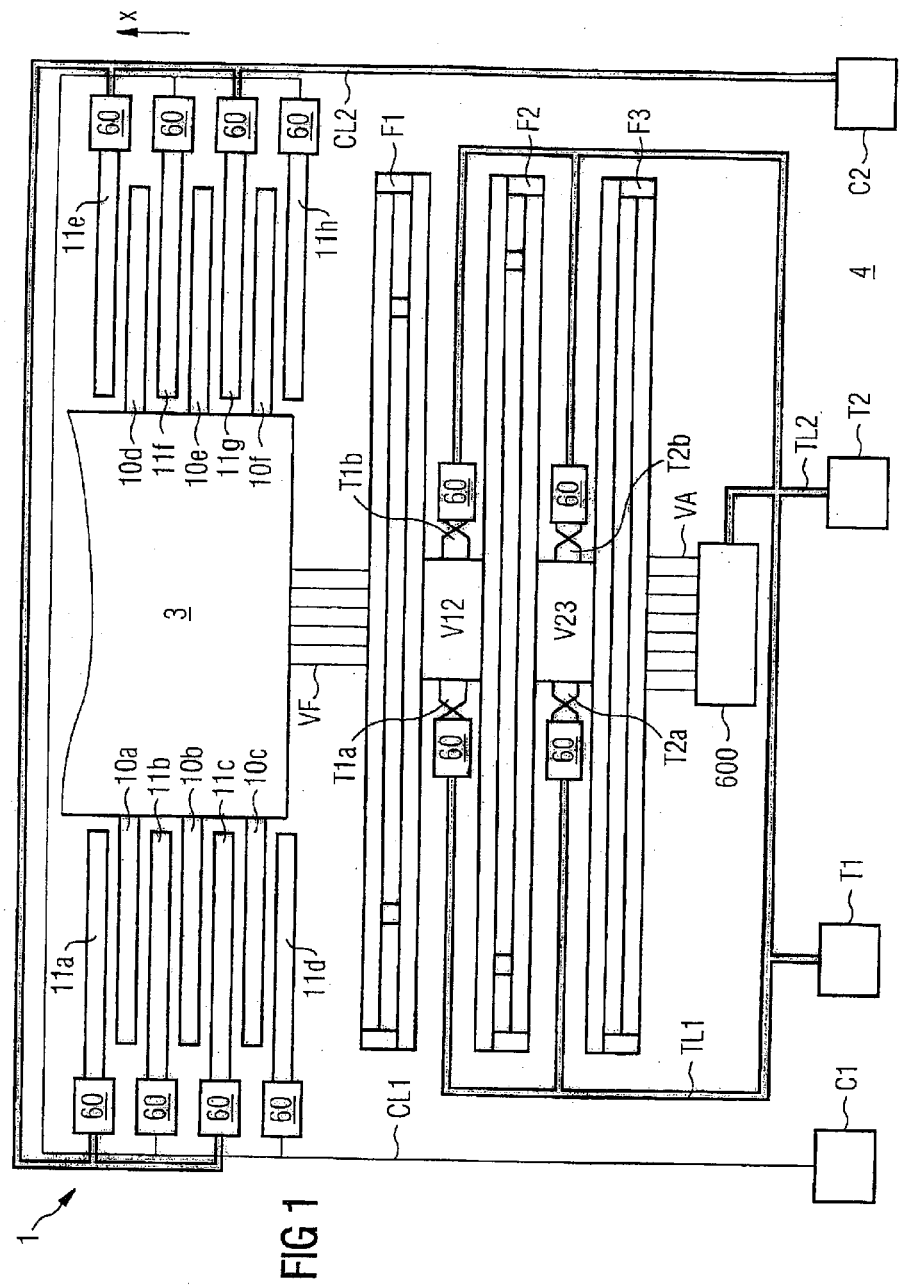

The present invention relates to a micromechanical component, in particular an acceleration sensor, having a flexible spring device for the spring mounting of a mass over a substrate, the flexible spring device being connected on the one hand with the mass and on the other hand being anchored in the substrate.

Although applicable to arbitrary micromechanical components and structures, in particular sensors and actuators, the present invention, as well as the problem on which it is based, is explained in relation to a micromechanical acceleration sensor that can be manufactured in silicon surface micromechanical technology.

Acceleration sensors, and in particular micromechanical acceleration sensors in surface micromechanical or volume micromechanical technology, are gaining increased market share in the area of motor vehicle equipment, and are increasingly replacing the previously standard piezoelectric acceleration sensors.

Standardly, the known micromechanical acceleration sensors operate in such a manner that, upon being deflected, the spring-mounted seismic mass device, which can be deflected in at least one direction by an external acceleration, effects a change of capacitance in a differential capacitor device connected therewith, this change being a measure of the acceleration.

The sensitivity of such known micromechanical acceleration sensors, e.g. for the measurement quantity acceleration, is currently set essentially by the rigidity of the spring mounting of the seismic mass, i.e., by the spring constant thereof. The associated specific integrated electrical circuit (ASIC) permits adjustment only in a relatively small range of sensitivity.

Micromechanical acceleration sensors for maximum accelerations between e.g. 2 g and 50 g (where g=acceleration due to gravity) are currently set only through differing spring rigidities; here, as a rule, there is little variation in the seismic masses.

Thus, in the known acceleration sensors it has turned out to be disadvantageous that different layouts are required for different maximum accelerations, and adjustment is possible only within a very small range.

ADVANTAGES OF THE INVENTION

The micromechanical component according to the present invention, having the features of claim 1, has the advantage that the spring rigidity can be adjusted in gradual fashion in a pre-measurement stage or a final measurement stage, so that a single layout or design can be used for a wide range of rigidities.

The idea on which the present invention is based is that in the micromechanical component, a structure that is or can be mechanically fixed, formed as a spring, can be unlocked or locked in order to set the effective rigidity of the flexible spring device in step-by-step fashion. For this purpose, two or more spring elements, having the same or different rigidities, are situated in series and/or in parallel, and a desired effective spring constant is set.

In the subclaims, advantageous developments and improvements of the micromechanical component indicated in claim 1 are given.

According to a preferred development, the mass is connected with a first spring element that can be moved in relation to the substrate, and is connected with one end of a second spring element via a first connecting web. At the first connecting web, a first anchoring structure that can be isolated is provided, for the isolatable anchoring of the first connecting web in relation to the substrate. In this way, an adjustable connection in series of at least two spring elements can be realized.

According to a further preferred development, the first isolatable anchoring structure has at least one first isolation region that can be isolated through the application of electrical current. This is a useful method for disconnecting a mechanical connection by melting, in a manner comparable to an electrical fuse.

According to a further preferred development, the first isolatable anchoring structure has two first isolation regions, which are provided at two opposite sides of the first connecting web. In this way, a stable, symmetrical anchoring can be realized.

According to a further preferred development, the second spring element is connected with one end of a third spring element via a second connecting web. At the second connecting web, a second isolatable anchoring structure is provided for the isolatable anchoring of the second anchoring web in relation to the substrate. In this way, additional spring elements can be connected in series in an analogous fashion.

According to a further preferred development, the second isolatable anchoring structure has at least one second isolation region that can be isolated through the application of electrical current.

According to a further preferred development, the second isolatable anchoring structure has two second isolation regions that are provided at two opposite sides of the second connecting web.

According to a further preferred development, the respective first and/or second isolation region has a first current line that is connected with the relevant isolatable anchoring structure, and a second current line that is connected with the flexible spring device, preferably with an anchoring thereof. In this way, the isolating current connection can be realized without a large additional expense.

According to a further preferred development, the first and second isolation region, or the first and second isolation regions, have different first current lines, so that they can be isolated selectively.

According to a further preferred development, the first and second isolation region, or the first and second isolation regions, have the same first current line and have different cross-sections, so that they can be selectively isolated. This design saves the provision of different first current lines for the isolation.

According to a further preferred development, the mass is connected with a first spring element that can be moved in relation to the substrate, and is connected, via a first connecting web, with one end of a second spring element. At the first connecting web, a first controllable anchoring structure is provided for the controllable anchoring of the first connecting web in relation to the substrate. A controllable anchoring structure has the advantage that it can be switched between the locked and unlocked states in reversible fashion. Moreover, in this way, in principle a continuous controlling (i.e., without gradations) of the effective spring constant is possible.

According to a further preferred development, the first controllable anchoring structure has at least one first isolation region that can be controlled by a generator device for a magnetic or electrical field. In this way, a contactless controlling can be achieved.

According to a further preferred development, the first controllable anchoring structure has two first isolation regions that are provided at two opposite sides of the first connecting web.

According to a further preferred development, the second spring element is connected, via a second connecting web, with one end of a third spring element. At the second connecting web, a second controllable anchoring structure is provided for the controllable anchoring of the second connecting web in relation to the substrate.

According to a further preferred development, the second controllable anchoring structure has at least one second isolation region that can be controlled by a generator device for a magnetic or electrical field.

According to a further preferred development, the second controllable anchoring structure has two second isolation regions that are provided at two opposite sides of the second connecting web.

DRAWINGS

Exemplary embodiments of the invention are shown in the drawing, and are explained in more detail in the following description.

Figure 2:
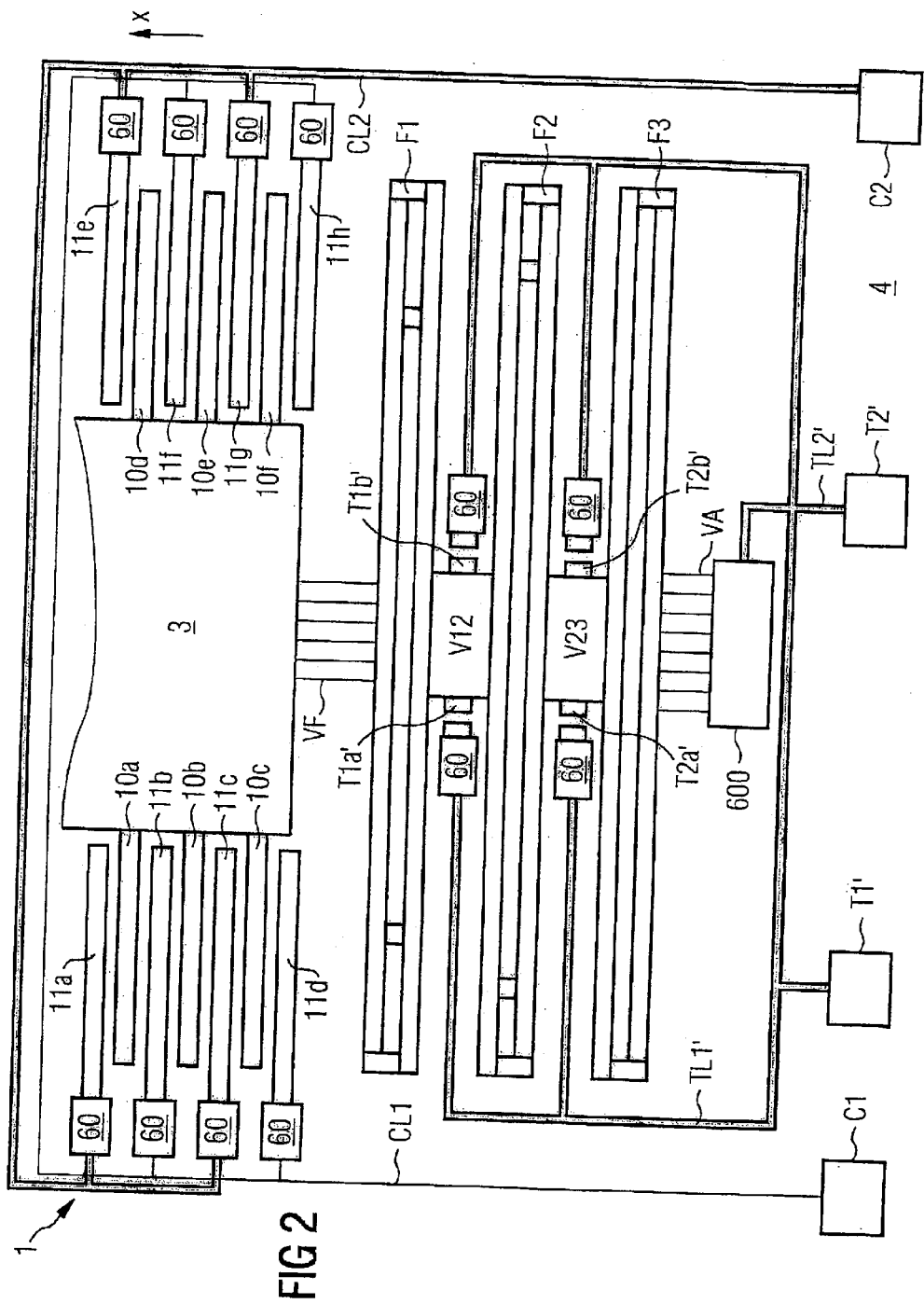

The Figures show:

FIG. 1 a top view of an acceleration sensor according to a first specific embodiment of the present invention; and FIG. 2 a top view of an acceleration sensor according to a second specific embodiment of the present invention.

DESCRIPTION OF THE EXEMPLARY EMBODIMENTS

In the figures, identical reference characters designate identical or functionally identical components.

FIG. 1 shows a top view of an acceleration sensor according to a first specific embodiment of the present invention.

In FIG. 1, 1 designates a micromechanical acceleration sensor, 3 designates a seismic mass, 4 designates a substrate, 10a–f designate movable electrodes attached to seismic mass 3, 11a–h designate fixed electrodes anchored in stationary fashion in substrate 4, 60 or 600 designate anchoring regions in substrate 4, C1 and C2 designate capacitor terminal connections, CL1 and CL2 designate capacitor terminal lines, F1, F2, F3 designate spring elements of the flexible spring device, T1 and T2 designate isolation terminal connections, T1a, T1b, and T2a, T2b, designate isolation lines, V12 designates a connecting web between F1 and F2, and V23 designates a connecting web between F2 and F3. VF designates a connecting web between seismic mass 3 and first flexible spring element F1, and VA designates a connecting web between third flexible spring element F3 and anchoring 600.

Micromechanical acceleration sensor 1 according to this first specific embodiment is constructed in such a way that its seismic mass 3 can be deflected as a result of accelerations in the x direction. Here, seismic mass 3 is suspended in elastic fashion over substrate 4 via flexible spring device F1, F2, F3. Flexible spring device F1, F2, F3 is in turn anchored in the substrate via anchoring 600, but in the depicted state is also connected via connecting webs V12 or V23 and corresponding isolation regions T1a, T1b, or T2a, T2b, which are each connected with an anchoring 60.

When there is a deflection in the x direction, a change of capacitance can be noted at terminal connections C1 and C2 of the differential capacitor device constructed from fixed electrodes 11a–h and movable electrodes 10a–f; this change of capacitance is a measure of the deflection.

In the exemplary embodiment shown in FIG. 1, three spring elements F1, F2, F3 having different rigidities are therefore situated one after the other, i.e., in a series circuit.

Here, for example, the more rigid spring element F1 is connected directly to seismic mass 3; the softer springs F2, F3 are coupled on through the respective connecting web V12 or V23. In the state shown in FIG. 1, however, only first spring element F1 is effective for the spring loading, because, as stated, the other two spring elements F2 and F3 are anchored in the substrate via the respective connecting web V12 or V23 and an anchoring structure 60; T1a, T1b or 60; T2a, T2b connected thereto.

This mechanical anchoring can be realized both in the epitaxial polysilicon for the electrodes and seismic mass 3 and also in the buried polysilicon for buried printed conductors. In this specific embodiment, it is realized in the epitaxial polysilicon. The details of this process are known in the prior art, and require no additional explanation here.

Via isolation terminal connections T1 and T2, an electrical current can be applied through isolation line TL1, anchoring 60, the respective isolation region T1a, T1b or T2a, T2b, the relevant connecting web V12, V23, and back to anchoring 600 and isolation line TL2 via spring elements F2 or F3 and connecting web VA. The anchoring of second spring element F2 or of third spring element F3 can be selectively isolated through this flow of current, thus setting a lower effective spring constant for the flexible spring device as a whole. This process is comparable to the burning through of an electrical single-use fuse when overloaded.

A suitable choice of the geometry or of the layer construction of the isolation regions allows the determination of the precise location for the isolation, and, given a plurality of spring elements, also enables the selection of the isolation region that is to be isolated at a particular current value. In general, in this specific embodiment the directed isolation of the structures in the isolation regions can take place through different electrical resistances in a common current line, and not only through different cross-sections or, for example, separate electrical supply lines.

If the structures are realized in epitaxial silicon, an aluminum layer can optionally be applied on partial areas of the structures for the local adaptation of the resistance.

In the example shown in FIG. 1, isolation regions T1a and T1b have a smaller cross-section than do isolation regions T2a and T2b. It is therefore to be expected that when there is a flow of current through this parallel system, isolation regions T1a and T1b will melt first, at a first, lower current, and isolation regions T2a and T2b will not melt until later, at a second, higher current, so that first the second spring element F2, and then third spring element F3, can be activated in step-by-step fashion.

The isolation can take place both during electrical premeasurement and also during electrical final measurement. The directed isolation can be monitored through the chronological curve of the current-voltage values in this process. The effective spring constant that is set for the flexible spring system can be determined during pre-measurement for example via the resonant frequency, and can be determined during the final measurement for example via the sensitivity.

FIG. 2 shows a top view of an acceleration sensor according to a second specific embodiment of the present invention.

In FIG. 2, in addition to the already-introduced reference characters, T1a', T1b', T2a', T2b40 designate a respective controllable isolation region, T1' and T2' designate a respective modified isolation terminal connection, and TL1' and TL2' designate modified isolation lines.

In this second specific embodiment, in the isolation region a generator device for a magnetic field is provided; here the electrical field strength can be controlled through the voltage applied at T1' and T2' (here, TL1' and TL2' are corresponding multiwire leads). In this way, the effective spring constant of the overall flexible spring device can be set quasi-continuously as a function of the generated magnetic field.

In other respects, the second specific embodiment is identical with the first specific embodiment.

Although the present invention has been described above on the basis of a preferred exemplary embodiment, it is not limited thereto, but rather can be modified in many ways.

In particular, the invention can be applied to arbitrary spring-mounted micromechanical components, and not only to acceleration sensors.

For example, arbitrary micromechanical base materials can be used, and not only the silicon substrate indicated as an example.

Although in the above example the isolation regions are electrical melt-through regions, the isolation regions can also be influenced in other ways. Thus, the isolation can be carried out in contactless fashion, for example using a laser.

Likewise, the contactless controlling of the effective spring constant can be realized by an electrical field, rather than by a magnetic field.

The geometry of the spring system is also not limited to the indicated series circuit of three spring elements; rather, an arbitrary series circuit/parallel circuit can have a multiplicity of spring elements whose effective spring constant can be externally influenced.

What is claimed is:

1. A micromechanical component, comprising:
    a substrate;
    a mass; and
    a flexible spring device for a spring mounting of the mass over the substrate, the flexible spring device being connected on the one hand with the mass and on the other hand being anchored in the substrate, wherein:
        the flexible spring device includes at least one flexible spring element having a movability in relation to the substrate that is capable of being modified in order to modify an effective spring constant of the flexible spring device, and
        the effective spring constant is modifiable as a function of a current.

2. The micromechanical component as recited in claim 1, wherein:
    the micromechanical component includes an acceleration sensor.

3. A micromechanical component, comprising:
    a substrate;
    a mass;
    a flexible spring device for a spring mounting of the mass over the substrate, the flexible spring device being connected on the one hand with the mass and on the other hand being anchored in the substrate, wherein the flexible spring device includes at least one flexible spring element having a movability in relation to the substrate that is capable of being modified in order to modify an effective spring constant of the flexible spring device;
    a first connecting web; and
    a first isolatable anchoring structure provided at the first connecting web for an isolatable anchoring of the first connecting web in relation to the substrate, wherein the mass is connected with a first spring element of the flexible spring device that is capable of being moved in relation to the substrate, and the first spring element is connected, via the first connecting web, with an end of a second spring element of the flexible spring device.

4. The micromechanical component as recited in claim 3, wherein:
    the first isolatable anchoring structure includes at least one first isolation region that is capable of being isolated through an application of an electrical current.

5. The micromechanical component as recited in claim 3, wherein:
    the first isolatable anchoring structure includes two first isolation regions that are provided at two opposite sides of the first connecting web.

6. The micromechanical component as recited in claim 4, further comprising:
    a second connecting web; and
    a second isolatable anchoring structure provided at the second connecting web for the isolatable anchoring of the second connecting web in relation to the substrate, wherein:
        the second spring element is connected, via the second connecting web, with an end of a third spring element of the flexible spring device.

7. The micromechanical component as recited in claim 6, wherein:
    the second isolatable anchoring structure includes at least one second isolation region that is capable of being isolated through an application of an electrical current.

8. The micromechanical component as recited in claim 6, wherein:
    the second isolatable anchoring structure includes two second isolation regions that are provided at two opposite sides of the second connecting web.

9. The micromechanical component as recited in claim 7, wherein:
    at least one of the at least one first isolation region and the at least one second isolation region includes a first current line that is connected with a respective one of the first isolatable anchoring structure and the second isolatable anchoring structure, and
    a second current line is connected with the flexible spring device.

10. The micromechanical component as recited in claim 7, wherein:
    the at least one first isolation region and the at least one second isolation region include different first current lines, so that the at least one first isolation region and the at least one second isolation region are capable of being selectively isolated.

11. The micromechanical component as recited in claim 7, wherein:
    the at least one first isolation region and the at least one second isolation region have the same first current line and have different cross-sections, so that the at least one first isolation region and the at least one second isolation region are capable of being selectively isolated.

12. A micromechanical component, comprising:

a substrate;

a mass;

a flexible spring device for a spring mounting of the mass over the substrate, the flexible spring device being connected on the one hand with the mass and on the other hand being anchored in the substrate, wherein the flexible spring device includes at least one flexible spring element having a movability in relation to the substrate that is capable of being modified in order to modify an effective spring constant of the flexible spring device;

a first connecting web; and a first controllable anchoring structure, wherein:

the mass is connected with a first spring element of the flexible spring device that is capable of being moved in relation to the substrate, and is connected, via the first connecting web, with an end of a second spring element of the flexible spring device, and the first controllable anchoring structure is provided at the first connecting web for a controllable anchoring of the first connecting web in relation to the substrate.

13. The micromechanical component as recited in claim 12, wherein:

the first controllable anchoring structure includes at least one first isolation region that is capable of being controlled by a generator device for one of a magnetic field and an electrical field.

14. The micromechanical component as recited in claim 13, wherein:

the first controllable anchoring structure includes two first isolation regions that are provided at two opposite sides of the first connecting web.

15. The micromechanical component as recited in claim 14, further comprising:

a second connecting web; and a second controllable anchoring structure, wherein:

the second spring element is connected, via the second connecting web, with an end of a third spring element of the flexible spring device, and the second controllable anchoring structure is provided at the second connecting web for a controllable anchoring of the second connecting web in relation to the substrate.

16. The micromechanical component as recited in claim 15, wherein:

the second controllable anchoring structure includes at least one second isolation region that is capable of being controlled through a generator device for one of a magnetic field and an electrical field.

17. The micromechanical component as recited in claim 15, wherein:

the second controllable anchoring structure includes two second isolation regions that are provided at two opposite sides of the second connecting web.

18. The micromechanical component as recited in claim 1, further comprising:

a first connecting web; and a first isolatable anchoring structure provided at the first connecting web for an isolatable anchoring of the first connecting web in relation to the substrate.

19. The micromechanical component as recited in claim 18, wherein the mass is connected with a first spring element of the flexible spring device, and the first spring element is connected with an end of a second spring element of the flexible spring device.

20. The micromechanical component as recited in claim 1, further comprising:

a first connecting web; and a first controllable anchoring structure.

21. The micromechanical component as recited in claim 20, wherein the mass is connected with a first spring element of the flexible spring device, and is connected with an end of a second spring element of the flexible spring device.

22. The micromechanical component as recited in claim 21, wherein the first controllable anchoring structure is provided at the first connecting web for a controllable anchoring of the first connecting web in relation to the substrate.

23. The micromechanical component as recited in claim 20, wherein the first controllable anchoring structure is provided at the first connecting web for a controllable anchoring of the first connecting web in relation to the substrate.

* * * * *

UNITED STATES PATENT AND TRADEMARK OFFICE
CERTIFICATE OF CORRECTION

PATENT NO. : 6,782,749 B2
DATED : August 31, 2004
INVENTOR(S) : Stefan Pinter

It is certified that error appears in the above-identified patent and that said Letters Patent is hereby corrected as shown below:

Title page,
Item [57], ABSTRACT,
Line 1, delete "The invention creates".
Line 1, change "a micromechanical" to -- A micromechanical --.
Line 3, delete "(F1, F2, F3) (3)".
Line 4, change "substrate (4)," to -- substrate, --.
Line 5, delete "(F1, F2, F3) (3)".
Line 6, change "substrate (4)." to -- substrate. --.
Line 7, delete "(F1, F2, F3) (F2, F3) (4)".
Lines 10-11, change "spring device (F1, F2, F3)." to -- spring device. --.

Column 1,
Line 4, change "Background of the Invention" to -- Field of the Invention --.
Line 11, insert heading -- Background Information --.
Line 47, change "Advantages of the Invention" to -- Summary of the Invention --.
Lines 63-65, delete "In the subclaims, ...are given."

Column 3,
Line 23, change "Drawings" to -- Brief Description of the Drawings --.
Lines 25-27, delete "Exemplary embodiments...the following description.".
Line 29, change "FIG. 1 a top view" to -- FIG. 1 shows a top view --.
Line 30, change "the present invention; and" to -- the present invention. --.
Line 31, change "FIG. 2 a top view" to -- FIG. 2 shows a top view --.
Lines 34-35, change "Description of the Exemplary Embodiments" to -- Detailed Description --.

Signed and Sealed this

Sixteenth Day of August, 2005

JON W. DUDAS
*Director of the United States Patent and Trademark Office*